United States Patent
Tsai et al.

(10) Patent No.: US 10,204,914 B2
(45) Date of Patent: Feb. 12, 2019

(54) METHOD FOR FABRICATING SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chien-Cheng Tsai, Kaohsiung (TW); Feng-Ming Huang, Pingtung County (TW); Ying-Chiao Wang, Changhua County (TW); Chien-Ting Ho, Taichung (TW); Li-Wei Feng, Kaohsiung (TW); Tsung-Ying Tsai, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/856,022

(22) Filed: Dec. 27, 2017

(65) Prior Publication Data

US 2018/0190664 A1  Jul. 5, 2018

(30) Foreign Application Priority Data

Dec. 30, 2016  (CN) .......................... 2016 1 1261914

(51) Int. Cl.
| | |
|---|---|
| *H01L 27/108* | (2006.01) |
| *H01L 29/423* | (2006.01) |
| *H01L 29/45* | (2006.01) |
| *H01L 29/06* | (2006.01) |
| *H01L 21/02* | (2006.01) |

(Continued)

(52) U.S. Cl.
CPC .. *H01L 27/10894* (2013.01); *H01L 21/02532* (2013.01); *H01L 21/02592* (2013.01); *H01L 21/02595* (2013.01); *H01L 21/3065* (2013.01); *H01L 21/3081* (2013.01); *H01L 27/10823* (2013.01); *H01L 27/10876* (2013.01)

(58) Field of Classification Search
CPC .......... H01L 29/0649; H01L 27/10897; H01L 27/10823; H01L 27/10855; H01L 27/10876; H01L 21/823462; H01L 21/823481; H01L 21/761; H01L 21/76229; H01L 21/823878; H01L 21/823871; H01L 27/10894; H01L 27/0928; H01L 23/5226

See application file for complete search history.

(56) References Cited

U.S. PATENT DOCUMENTS

| | | | |
|---|---|---|---|
| 9,431,324 B2 | 8/2016 | Shin | |
| 2008/0254584 A1* | 10/2008 | Choi | ..................... H01L 27/105 438/258 |

(Continued)

*Primary Examiner* — Brian Turner
(74) *Attorney, Agent, or Firm* — Winston Hsu

(57) ABSTRACT

A method for fabricating semiconductor device includes the steps of: providing a substrate having a memory region and a periphery region; forming a first buried gate and a second buried gate in the substrate on the memory region; forming a first silicon layer on the substrate on the periphery region; forming a stacked layer on the first silicon layer; forming an epitaxial layer on the substrate between the first buried gate and the second buried gate; and forming a second silicon layer on the epitaxial layer on the memory region and the stacked layer on the periphery region.

8 Claims, 4 Drawing Sheets

(51) Int. Cl.
*H01L 21/3065* (2006.01)
*H01L 21/308* (2006.01)

(56) References Cited

U.S. PATENT DOCUMENTS

| | | | | |
|---|---|---|---|---|
| 2010/0244153 A1* | 9/2010 | Hsu | ................. | H01L 21/823807 |
| | | | | 257/408 |
| 2011/0133283 A1* | 6/2011 | Park | ................ | H01L 21/823456 |
| | | | | 257/368 |
| 2015/0221657 A1* | 8/2015 | Sashida | ............ | H01L 27/11507 |
| | | | | 257/532 |
| 2015/0243665 A1* | 8/2015 | Nakata | .............. | H01L 27/10814 |
| | | | | 257/296 |
| 2015/0294934 A1 | 10/2015 | Kadoya | | |
| 2015/0311297 A1* | 10/2015 | Im | ....................... | H01L 29/4236 |
| | | | | 257/331 |

* cited by examiner

METHOD FOR FABRICATING SEMICONDUCTOR DEVICE

BACKGROUND OF THE INVENTION

1. Field of the Invention

The invention relates to a method for fabricating semiconductor device, and more particularly to a method for fabricating a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: providing a substrate having a memory region and a periphery region; forming a first buried gate and a second buried gate in the substrate on the memory region; forming a first silicon layer on the substrate on the periphery region; forming a stacked layer on the first silicon layer; forming an epitaxial layer on the substrate between the first buried gate and the second buried gate; and forming a second silicon layer on the epitaxial layer on the memory region and the stacked layer on the periphery region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
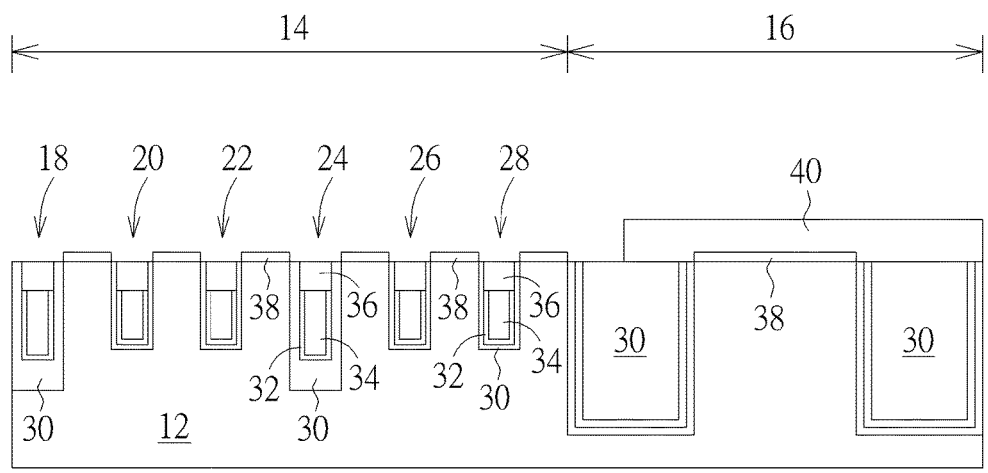
FIGS. 1-8 illustrate a method for fabricating semiconductor device according to an embodiment of the present invention.

Referring to FIGS. 1-8, FIGS. 1-8 illustrate a method for fabricating semiconductor device according to an embodiment of the present invention. As shown in FIG. 1, a substrate 12 such as a silicon substrate or silicon-on-insulator (SOI) substrate is provided, and a memory region 14 and a periphery region 16 are defined on the substrate 12, in which the memory region 14 could be used for fabricating dynamic random access memory (DRAM) devices having buried gates and the periphery region 16 could be used for fabricating active devices such as metal-oxide semiconductor (MOS) transistors.

In this embodiment, a plurality of buried gates 18, 20, 22, 24, 26, 28 are disposed in the substrate 12 on the memory region 14 and a shallow trench isolation (STI) 30 is disposed between the memory region 14 and the periphery region 16 to separate the devices on the memory region 14 and the periphery region 16. In this embodiment, each of the buried gates 18, 20, 22, 24, 26, 28 preferably includes a barrier layer 32, a conductive layer 34, and a hard mask 36 disposed on the barrier layer 32 and the conductive layer 34, in which the top surfaces of the hard masks 36 are even with the top surface of the substrate 12. Preferably, the barrier layer 32 is made of material including but not limited to for example titanium nitride (TiN), the conductive layer 34 is made of tungsten (W), and the hard mask 36 is made of silicon nitride (SiN), but not limited thereto.

Next, a thin oxide layer 38 is formed on the surface of the substrate 12 between the buried gates 18, 20, 22, 24, 26, 28 and the surface of the substrate 12 on the periphery region 16, and a first silicon layer 40 is formed on the substrate 12 on periphery region 16, in which the first silicon layer 40 could include material such as but not limited to for example amorphous silicon or polysilicon and most preferably amorphous silicon. In this embodiment, the formation of the first silicon layer 40 could be accomplished by first depositing a silicon layer (not shown) on the memory region 14 and the periphery region 16, and a photo-etching process is conducted to remove the silicon layer on the memory region 14 for forming a patterned first silicon layer 40 on the periphery region 16.

Figure 2:
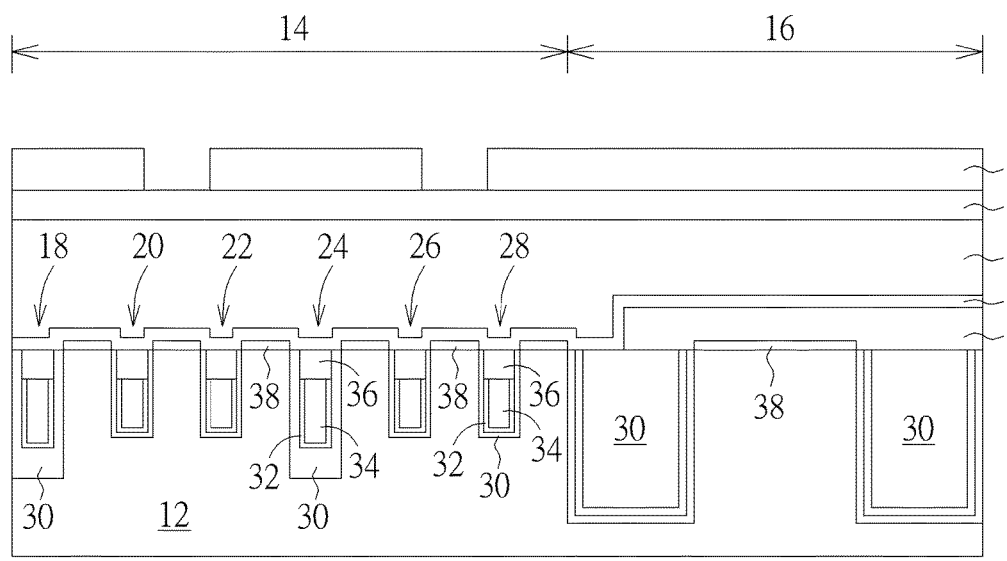

Next, as shown in FIG. 2, a stacked layer 42 is formed on the substrate 12 on memory region 14 and the first silicon layer 40 on periphery region 16, and an organic dielectric layer (ODL) 44, a silicon-containing hard mask bottom anti-reflective coating (SHB) 46, and a patterned mask 48 are sequentially formed on the stacked layer 42. In this embodiment, the stacked layer 42 preferably includes an oxide-nitride (ON) stacked layer or an oxide-nitride-oxide (ONO) stacked layer and the patterned mask 48 preferably includes a patterned resist, but not limited thereto.

Figure 3:
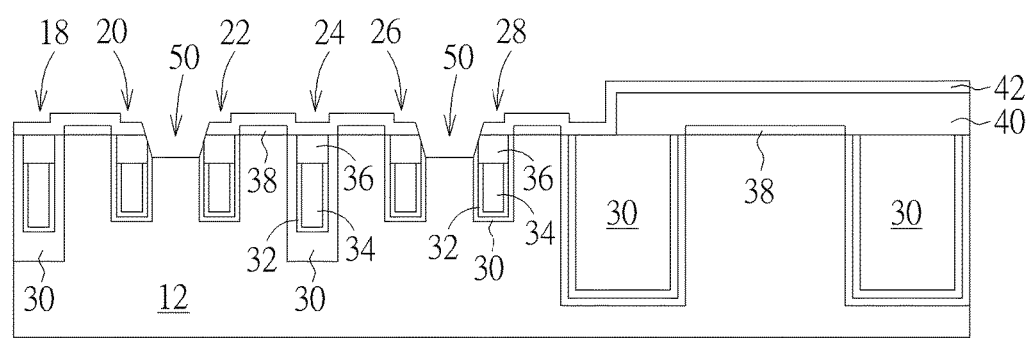

Next, as shown in FIG. 3, an etching process is conducted by using the patterned mask 48 as mask to remove part of the SHB 46, part of the ODL 44, part of the stacked layer 42, and the substrate 12 between buried gates 20, 22 and the substrate 12 between buried gates 26, 28 to form recesses 50. The patterned mask 48, the SHB 46, and the ODL 44 are removed thereafter.

Figure 4:
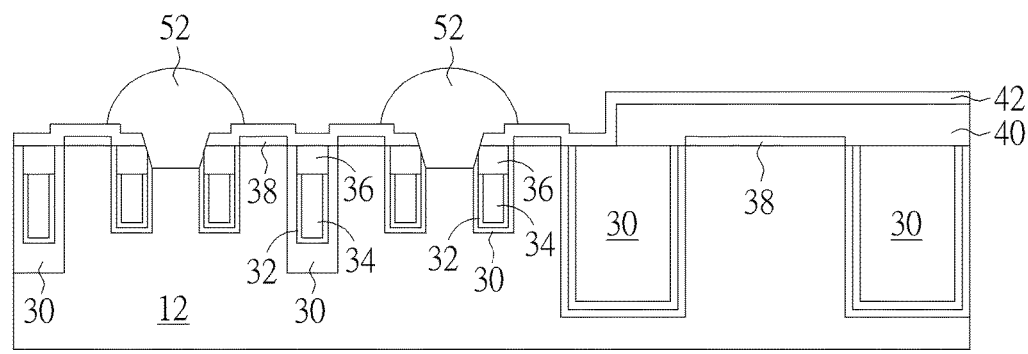

Next, as shown in FIG. 4, a selective epitaxial growth process is conducted to form epitaxial layers 52 on the substrate 12 between buried gates 20, 22 and the substrate 12 between buried gates 26, 28, in which the epitaxial layers 52 are grown to fill the recesses 50 and protruding above the substrate 12 surface. In this embodiment, the epitaxial layers 52 could include silicon, germanium, or silicon germanium, but not limited thereto.

Figure 5:
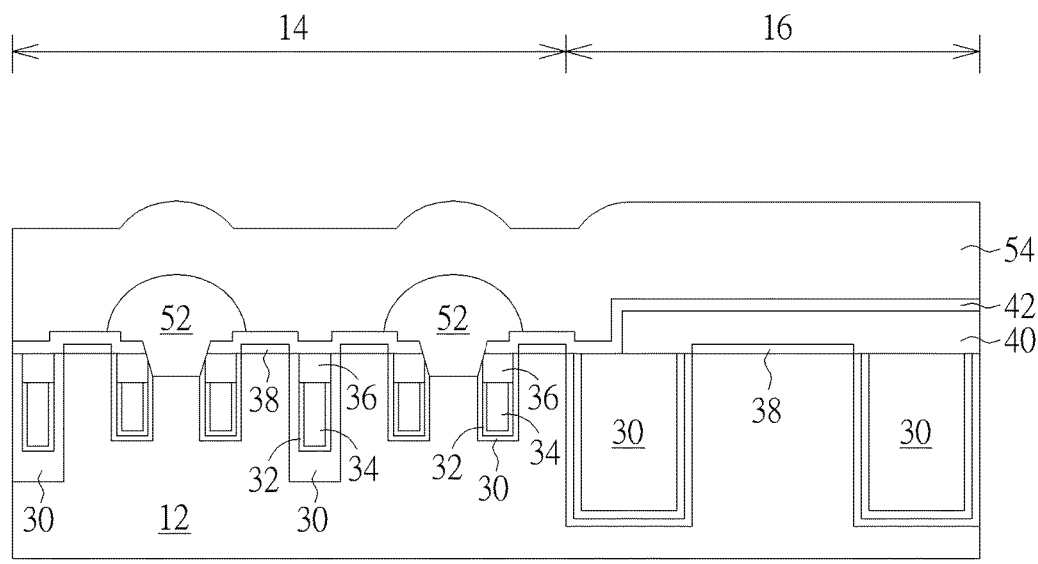

Next, as shown in FIG. 5, a second silicon layer 54 is formed on the epitaxial layers 52 on memory region 14 and the stacked layer 42 on periphery region 16. In this embodiment, the first silicon layer 40 and the second silicon layer 54 are preferably made of different material while the two layers 40, 54 could be selected from the group consisting of polysilicon and amorphous silicon. Nevertheless, according to an embodiment of the present invention, the first silicon layer 40 and the second silicon layer 54 could also be made of same material depending on the demand of the process while the two layers 40 and 54 could be selected from the group consisting of polysilicon and amorphous silicon.

It should be noted that the present invention preferably forms epitaxial layers 52 on the substrate 12 between buried gates 20, 22 and the substrate 12 between buried gates 26, 28 before the second silicon layer 54 is formed. By using the epitaxial layers 52 as a cushion or padding between the buried gates 20, 22 and the buried gates 26, 28, it would be desirable to create a raised effect so that the second silicon layer 54 formed afterwards on top of the epitaxial layers 52 extending from the memory region 14 to the periphery region 16 could obtain better overall smoothness.

Figure 6:
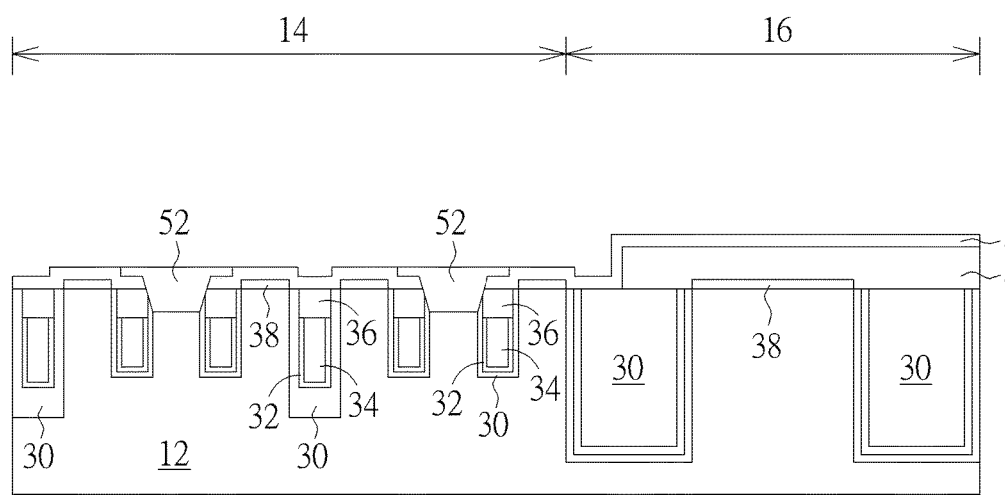

Next, as shown in FIG. 6, an etching process is conducted to remove the second silicon layer 54 on the memory region 14 and the periphery region 16 as well as part of the epitaxial layers 52 on the memory region 14 for exposing the stacked layer 42 underneath, in which the top surface of the remaining epitaxial layer 52 is even with the top surface of the stacked layer 42 on the memory region 14 after the etching process. In this embodiment, the etching process used to remove the second silicon layer 54 and part of the epitaxial layers 52 preferably includes a dry etching process and the etching gas used in the etching process preferably includes hydrogen bromide (HBr).

Figure 7:
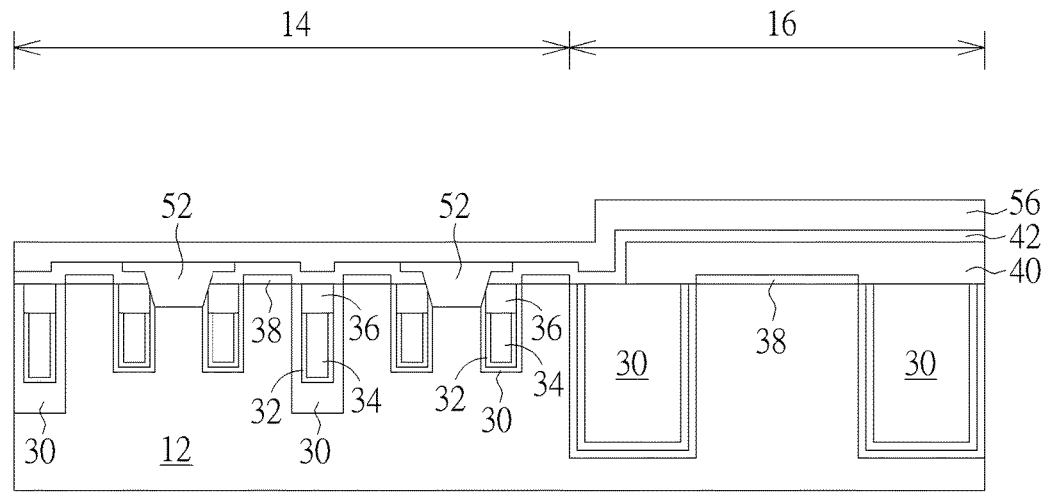

Next, as shown in FIG. 7, a third silicon layer 56 is formed on the stacked layer 42 on both memory region 14 and periphery region 16. In this embodiment, the third silicon layer 56, the second silicon layer 54, and the first silicon layer 40 could be made of same material or different while the third silicon layer 56 could also be selected from the group consisting of polysilicon and amorphous silicon.

Figure 8:
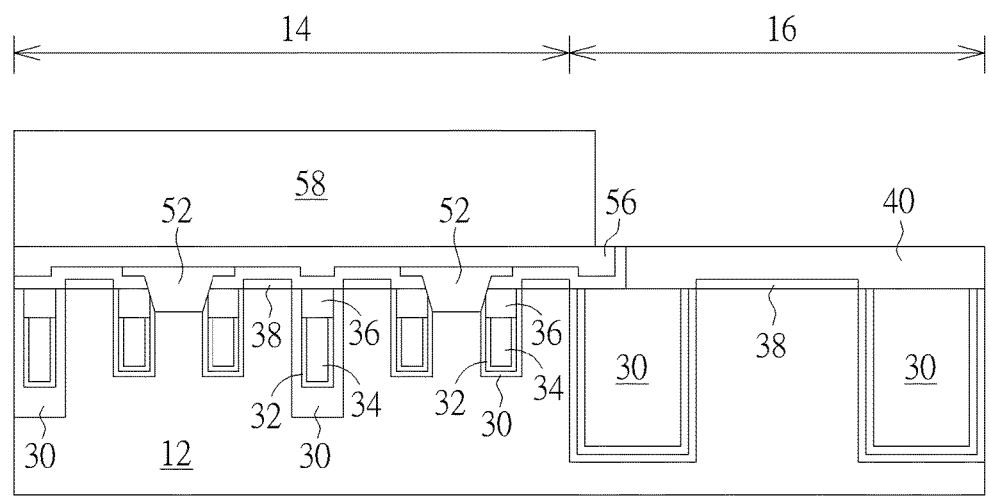

Next, as shown in FIG. 8, a patterned mask 58 such as a patterned resist is formed on the third silicon layer 56 on the memory region 14, and an etching process is conducted to remove part of the third silicon layer 56 on the periphery region 16 for exposing the stacked layer 42 and first silicon layer 40 on the periphery region 16. This completes the fabrication process prior to the formation of bit lines. In this embodiment, the process disclosed in the aforementioned FIGS. 6-8 provides a multi-stage etching approach by first conducting a first etching process to remove the silicon layer 54 on the memory region 14 and periphery region 16 completely, forming a third silicon layer 56 on the memory region 14 and periphery region 16, and then conducting another etching process to remove the third silicon layer 56 on the periphery region 16. By using the multi-stage etching process to remove the silicon layer on the memory region 14 and periphery region 16, better smoothness could be obtained for the final silicon layer formed on both regions.

It should be noted that even though epitaxial layers 52 are formed in the recesses 50 before the fabrication process from FIGS. 6-8 are conducted, according to an embodiment of the present invention, it would also be desirable to omit the formation of the epitaxial layers 52 by directly forming the second silicon layer 54 on the memory region 14 and periphery region 16 after the recesses 50 are formed in FIG. 3, and then carry out the aforementioned fabrication processes from FIGS. 6-8, which is also within the scope of the present invention.

Next, bit lines and contact plugs, and gate structures on the periphery region 16 could be formed depending on the demand of the product. For instance, it would be desirable to form bit line contacts adjacent to two sides of the buried gates for electrically connecting the source/drain region and bit lines formed afterwards and storage node contacts electrically connecting the source/drain region and capacitor formed thereafter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a memory region and a periphery region;
   forming a first buried gate and a second buried gate in the substrate on the memory region;
   forming a first silicon layer on the substrate on the periphery region;
   forming a stacked layer on the first silicon layer;
   forming an epitaxial layer on the substrate between the first buried gate and the second buried gate;
   forming a second silicon layer on the epitaxial layer on the memory region and the stacked layer on the periphery region;
   performing an etching process to remove the second silicon layer on the memory region and the periphery region for exposing the stacked layer;
   forming a third silicon layer on the stacked layer on the memory region and the periphery region; and
   removing part of the third silicon layer on the periphery region.

2. The method of claim 1, further comprising:
   forming the stacked layer on the substrate on the memory region and the first silicon layer on the periphery region;
   removing part of the stacked layer on the memory region and the substrate between the first buried gate and the second buried gate to form a recess;
   forming the epitaxial layer in the recess; and
   forming the second silicon layer on the epitaxial layer.

3. The method of claim 1, further comprising removing part of the epitaxial layer on the memory region while performing the etching process.

4. The method of claim 1, wherein the second silicon layer and the third silicon layer comprise same material.

5. The method of claim 1, wherein the first silicon layer and the second silicon layer comprise different material.

6. The method of claim 1, wherein the first silicon layer comprises amorphous silicon.

7. The method of claim 1, wherein the stacked layer comprises an oxide-nitride-oxide (ONO) stacked layer.

8. The method of claim 1, wherein the second silicon layer comprises polysilicon.

* * * * *